(12) United States Patent
Cho et al.

(10) Patent No.: US 7,589,030 B2
(45) Date of Patent: Sep. 15, 2009

(54) LIQUID CRYSTAL DISPLAY DEVICE AND FABRICATING METHOD THEREOF

(75) Inventors: Ki Sul Cho, Gumi-si (KR); Young Seok Choi, Gumi-si (KR); Byung Yong Ahn, Daegu-si (KR); Tae Ung Hwang, Gyeongbuk (KR); Dong Jun Min, Seoul (KR); Bo Kyoung Jung, Junju-si (KR)

(73) Assignee: LG. Display Co., Ltd., Seoul (KR)

( * ) Notice: Subject to any disclaimer, the term of this patent is extended or adjusted under 35 U.S.C. 154(b) by 410 days.

(21) Appl. No.: 11/476,427

(22) Filed: Jun. 27, 2006

(65) Prior Publication Data

US 2007/0004069 A1    Jan. 4, 2007

(30) Foreign Application Priority Data

Jun. 30, 2005    (KR) ................... 10-2005-0058391

(51) Int. Cl.
*H01L 21/31* (2006.01)
*H01L 21/469* (2006.01)

(52) U.S. Cl. .................... 438/787; 438/950; 257/72; 349/106

(58) Field of Classification Search ................... 257/72; 349/106; 438/787, 950
See application file for complete search history.

(56) References Cited

U.S. PATENT DOCUMENTS

| 7,205,571 | B2 * | 4/2007 | Ahn et al. | 257/72 |
| 2004/0166694 | A1 * | 8/2004 | Won et al. | 438/787 |
| 2004/0239838 | A1 * | 12/2004 | Lai | 349/106 |
| 2005/0134756 | A1 * | 6/2005 | Yang et al. | 349/43 |

* cited by examiner

*Primary Examiner*—Phuc T Dang
(74) *Attorney, Agent, or Firm*—Brinks Hofer Gilson & Lione

(57) ABSTRACT

A method of fabricating a liquid crystal display device includes performing a first mask process to form a gate line, a gate pad, and a gate electrode on a substrate. The method of fabricating a liquid crystal display device further includes performing a second mask process to form an active layer on the gate electrode, performing a third mask process to form a pixel electrode contacting the active layer, and performing a fourth mask process to form a source electrode and a drain electrode on the active layer.

18 Claims, 12 Drawing Sheets

LIQUID CRYSTAL DISPLAY DEVICE AND FABRICATING METHOD THEREOF

The present application claims the benefit of Korean Patent Application No. 2005-58391 filed in Korea on Jun. 30, 2005, which is hereby incorporated by reference.

FIELD

The present invention relates to a liquid crystal display device, and more particularly, to a liquid crystal display device with a simplified fabricating process and an improved image quality, and a fabricating method thereof.

BACKGROUND

A cathode ray tube (CRT) has been widely used till now and has many advantages in views of performance and price. However, the CRT also has disadvantages in views of miniaturization and portability.

In order to replace the CRT, a light and slim liquid crystal display device (LCD) has been developed which can realize high brightness, large size, low power consumption, and low cost. The LCD has more excellent resolution than other flat display devices. Also, in displaying moving pictures, the LCD exhibits rapid response time comparable to the CRT.

The LCD includes a thin film transistor (TFT) substrate in which pixel electrodes and TFTs are formed, and a color filter substrate in which R, G and B color filter layers are formed. The TFT substrate and the color filter substrate are attached together, with a liquid crystal layer being interposed therebetween. The TFT substrate and the color filter substrate are fabricated through several mask processes.

FIG. 1 is a plan view illustrating a pixel region of a related art LCD.

Referring to FIG. 1, gate lines 11a and 11b for applying driving signals and data lines 13a and 13b for applying data signals are intersected together to define unit pixel regions. A TFT serving as a switching element is disposed at the intersecting region of the gate line 11a and the data line 13a.

A pixel electrode 9 formed of transparent metal is disposed in the unit pixel region. The pixel electrode 9 electrically contacts the TFT and has one edge overlapped with the adjacent gate line 11b, thereby forming an auxiliary storage capacitor.

Also, a gate pad 12 receiving the driving signal from the circuit board is formed at an edge of the gate line 11a. A gate contact pad 22 is formed on the gate pad 12 so as to improve an electrical contact characteristic.

Likewise, a data pad 23 receiving the data signal from the circuit board is formed at an edge of the data line 13a. A data contact pad 33 is formed on the data pad 23 so as to improve an electrical contact characteristic.

FIG. 2 is a sectional view taken along lines I-I', II-II', III-III' and IV-IV' of FIG. 1, showing the pixel region, the data line, the storage region, and the gate pad region, respectively.

A method of fabricating the related art LCD will be described below with reference to FIG. 2.

Referring to FIG. 2, a gate metal layer is formed on a transparent insulation substrate 10. The gate metal layer is exposed, developed and etched through a first mask process to form a gate electrode 1 in a region I-I' where a TFT is to be formed. Simultaneously, gate lines 11a and 11b and a gate pad 12 are formed.

Then, a gate insulating layer 2, an amorphous silicon layer, a doped amorphous silicon layer are sequentially formed on the insulating substrate 10 and are etched through a second mask process to form an active layer 4 on the gate electrode 1. The active layer 4 includes a channel layer and an ohmic contact layer.

Next, a metal layer is formed on the insulation substrate 10 in which the active layer 4 is formed, and a source electrode 6a, a drain electrode 6b, a data line 13a, and a data pad (not shown) are formed on the active layer 4 through a third mask process.

After forming the source electrode 6a and the drain electrode 6b, a passivation layer 8 is formed on the insulation substrate 10, and a contact hole process is performed to open the drain electrode 6b, the gate pad and the data pad through a fourth mask process.

After the contact hole process, a transparent metal is formed on the insulation substrate 10, and a pixel electrode 9, a gate contact pad 22 and a data contact pad are formed through a fifth mask process, thereby completing the TFT substrate of the LCD.

However, when the TFT substrate is fabricated through the five-mask process, the fabrication process is complicated and the manufacturing cost increases. Specifically, the complicated fabrication process increases the defect rate and decreases the production yield.

Also, a 4-mask process has been developed to form the source electrode, the drain electrode and the active layer through a 1-mask process. In such a process, an active layer wider than a data line width is inevitably formed under the data line, resulting in the degradation of the image quality.

When the LCD is driven, a tail-shaped defect along the data line (which is called an active tail defect) is detected.

Also, comparing with the 5-mask process, the 4-mask process causes a problem of producing a bad quality pattern due to the height difference with the thereafter formed line as height of the source/drain electrode of the 4-mask progress is increased.

SUMMARY

Accordingly, the present invention is directed to an LCD and a fabricating method thereof that substantially obviate one or more problems due to limitations and disadvantages of the related art.

A method of fabricating an LCD includes performing a first mask process to form a gate line, a gate pad, and a gate electrode on a substrate. The method of fabricating an LCD further includes performing a second mask process to form an active layer on the gate electrode, performing a third mask process to form a pixel electrode contacting the active layer, and performing a fourth mask process to form a source electrode and a drain electrode on the active layer.

In another aspect of the present invention, a liquid crystal display device comprises a gate line and a data line intersected to define a unit pixel region. The liquid crystal display device further comprises a thin film transistor disposed at an intersecting region of the gate line and the data line, and a pixel electrode a portion of which is formed between a drain electrode and an active layer. The pixel electrode directly contacts the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incor-

Figure 1:
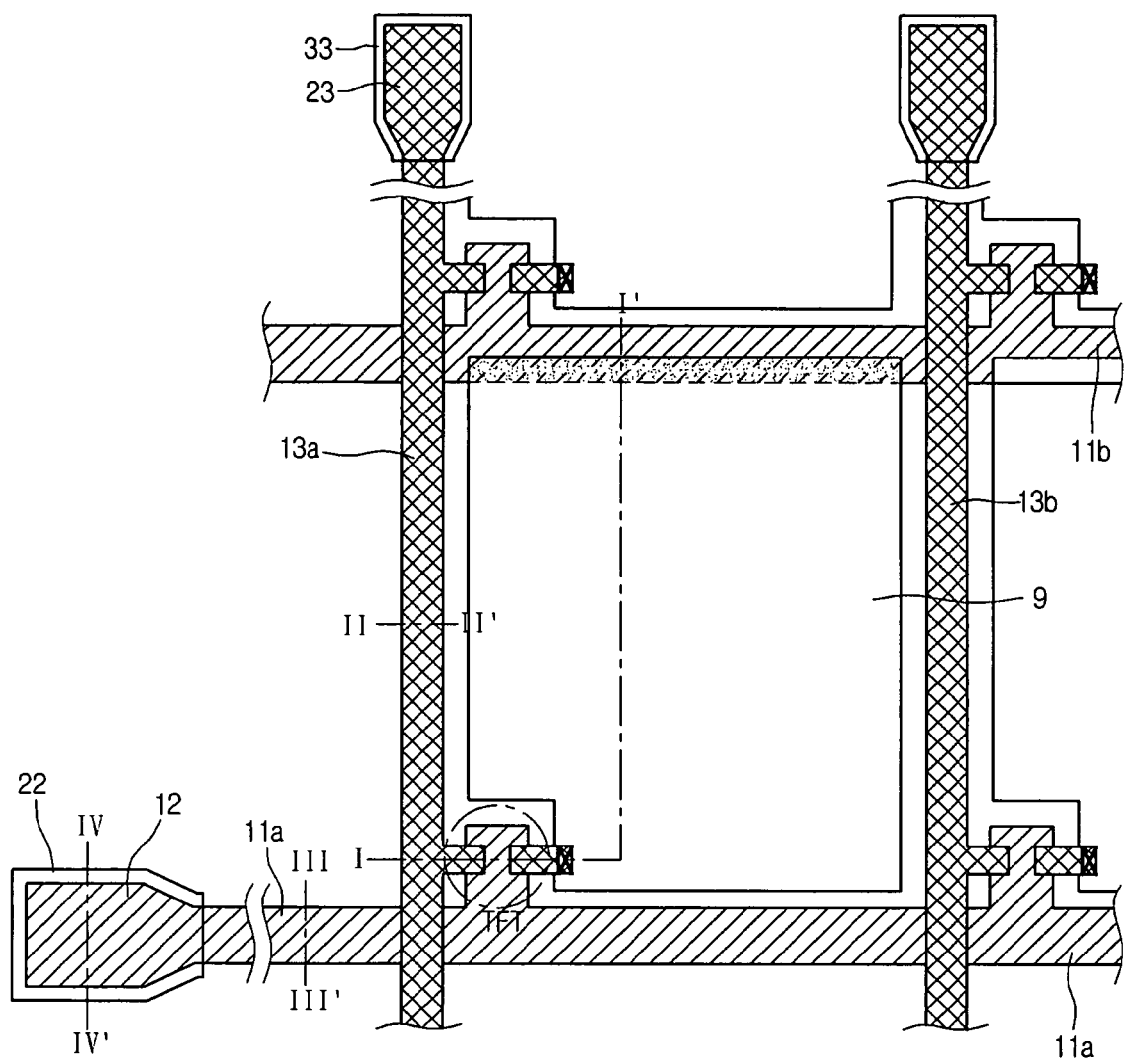
Figure 2:
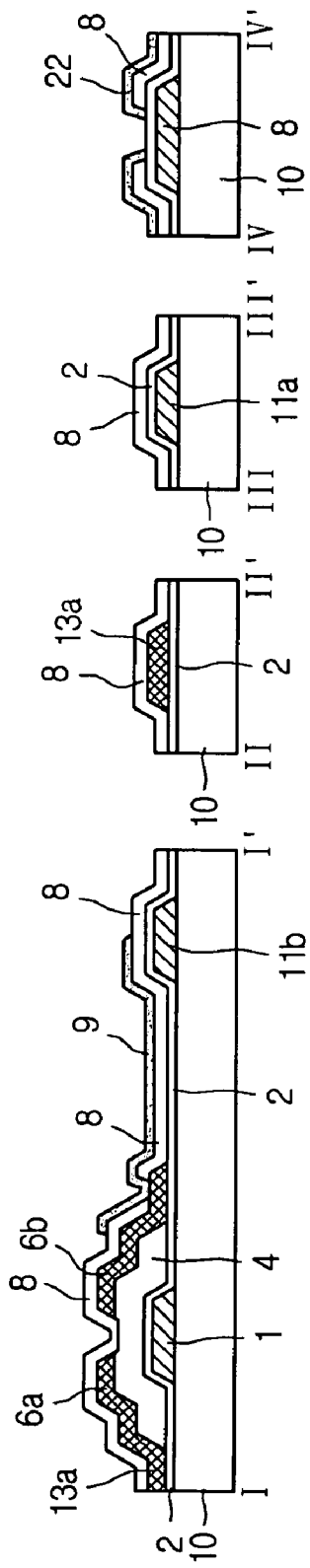
Figure 3:
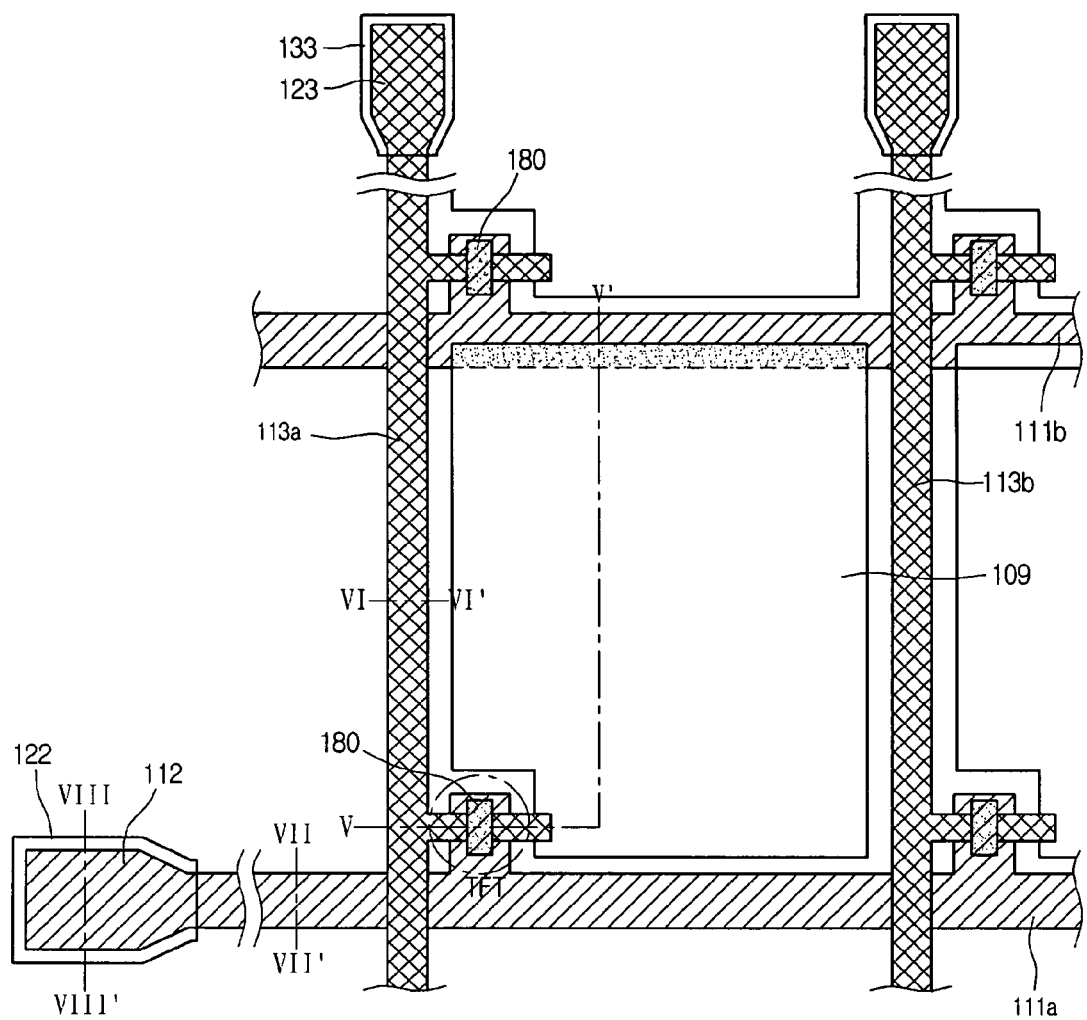

3 porated in and constitute a part of this application, illustrate embodiment(s) of the invention and together with the description serve to explain the principle of the invention. In the drawings:

FIG. 1 is a plan view of a pixel region in a related art LCD;

FIG. 2 is a sectional view illustrating a pixel region, a data line, a storage region, a gate line, and a gate pad region of FIG. 1;

FIG. 3 is a plan view of a pixel region in an LCD according to an embodiment of the present invention; and FIGS. 4A to 4I are sectional views illustrating a method of fabricating an LCD according to an embodiment of the present invention.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

FIG. 3 is a plan view of a pixel region in an LCD according to an embodiment of the present invention.

Referring to FIG. 3, gate lines 111a and 111b and data lines 113a and 113b are intersected together to define unit pixel regions. A TFT serving as a switching element is disposed at the intersecting region of the gate line 111a and the data line 113a.

Since the TFT does not use a passivation layer, an oxide layer 180 is formed on an exposed active layer of the TFT so as to protect the device. The oxide layer 180 may be formed of $SiO_2$, $SiN_2$, or $SiH_2$ using plasma treatment.

A pixel electrode 109 formed of a transparent metal is disposed in the unit pixel region. The pixel electrode 109 is formed between the drain electrode and the active region of the TFT. The pixel electrode 109 electrically contacts the drain electrode of the TFT and has one edge overlapped with the adjacent gate line 111b, thereby forming an auxiliary storage capacitor.

Also, a gate pad 112 receiving the driving signal from the circuit board is formed at an edge of the gate line 111a. A gate contact pad 122 is formed on the gate pad 112 for electrical contact.

Likewise, a data pad 123 receiving the data signal from the circuit board is formed at an edge of the data line 113a. A data contact pad 133 is formed on the data pad 123 for electrical contact.

The pixel structure of the LCD according to the present invention is similar to that of the related art. However, according to the present invention, the passivation layer is not used and thus the oxide layer 180 is formed on the active layer of the TFT. Also, the source electrode and the drain electrode of the TFT are formed after the formation of the pixel electrode 109. Therefore, there is a difference in the contact region of the drain electrode and the pixel electrode. At the same time when the drain electrode of the TFT is formed, it directly contacts the pixel electrode 109 because no passivation is formed therebetween. Therefore, unlike the related art, the drain electrode of the TFT does not contact the pixel electrode via the hole passing through the passivation layer.

A method of fabricating the LCD according to an embodiment of the present invention will be described below in detail with reference to FIGS. 4A to 4I.

FIGS. 4A to 4I are sectional views taken along lines V-V' (a TFT/pixel electrode/auxiliary storage capacitance region), line VI-VI' (a data line region), a line VII-VII' (a gate line region), and a line VIII-VIII' (a gate pad region) in FIG. 3.

4

Figure 4A:
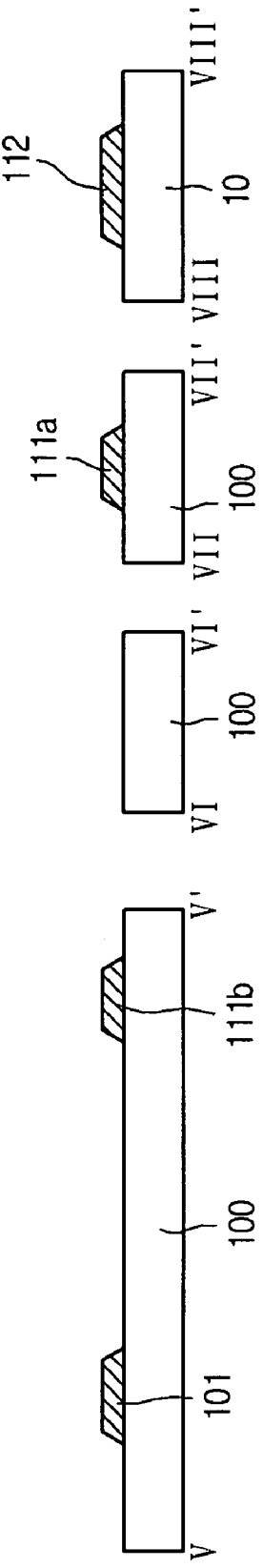

Referring to FIG. 4A, a metal layer is deposited on a transparent insulation substrate 100 and then is exposed, developed and etched through a first mask process to form a gate electrode 101, gate lines 111a and 111b, and a gate pad 112 in a TFT region at the same time.

Figure 4B:
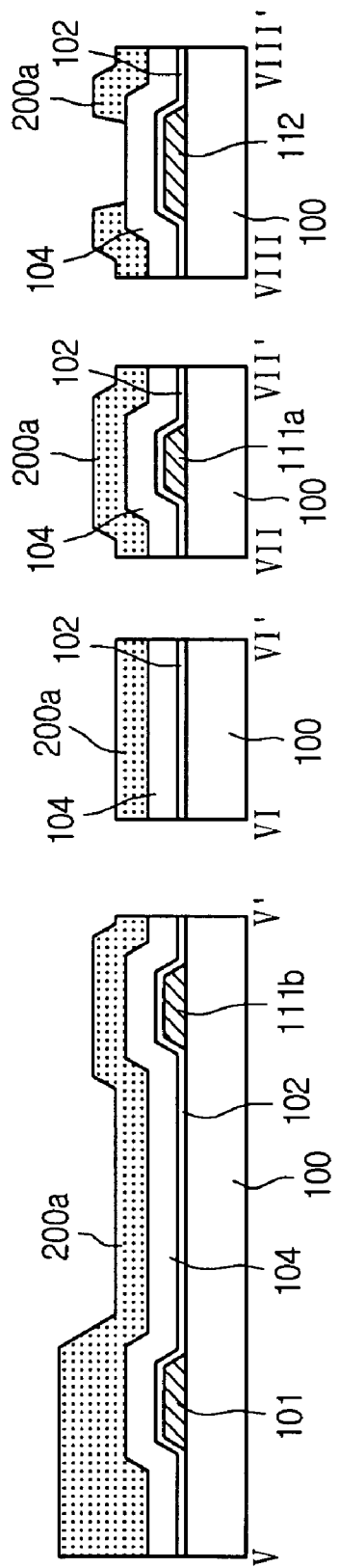
Figure 4C:
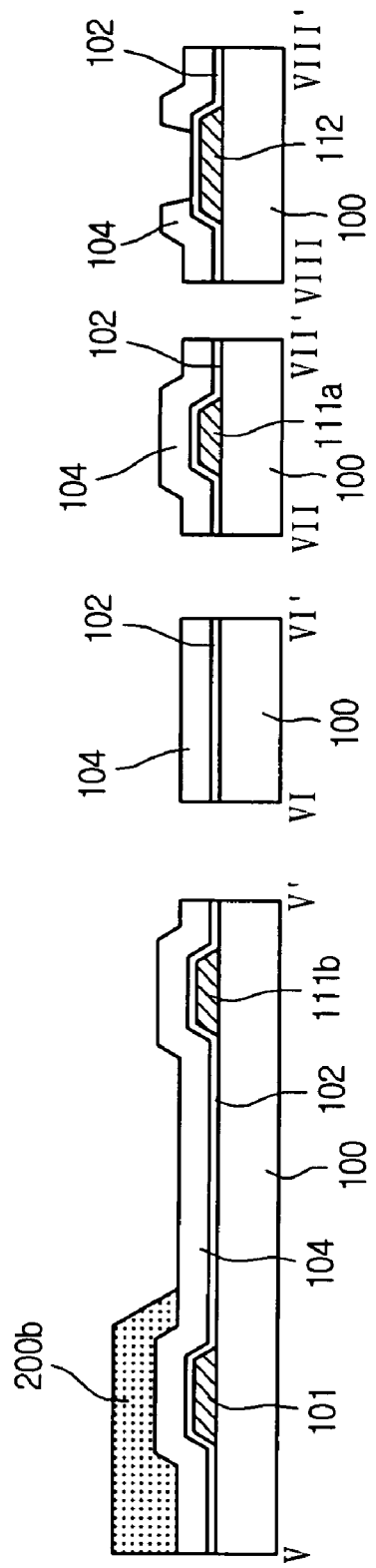

Referring to FIGS. 4B and 4C, a gate insulating layer 102 and an active layer 104 having an amorphous silicon layer and a doped amorphous silicon layer are sequentially formed on the insulation substrate 100.

Then, a photoresist is coated on the active layer 104 through a second mask process, and an exposure process and a development process are performed to half-tone photoresist patterns 200a with different thickness according to an amount of exposure.

In this embodiment, photoresist patterns are formed according to a different amount of exposure using a diffraction mask or half-tone mask during the second mask process.

The half-tone photoresist patterns 200a have a full exposing portion, a full shielding region, and a semi-transmitting region. A thickness of the TFT region is equal to that of the photoresist coated corresponding to the full shielding region in the upper portion of the TFT, and a thickness of the semi-transmitting region is less than that of the photoresist coated corresponding to a region other than the TFT region.

In the upper portion of the gate pad 112, the coated photoresist is removed corresponding to the full exposing region.

After the half-tone photoresist patterns 200a are formed, a first etch process (dry etch) is performed to etch the gate insulating layer 102 and the active layer 104 to form a contact hole. Consequently, the gate pad 112 is opened.

Then, an ashing process is performed on the half-tone photoresist patterns 200a to remove all photoresist existing on the active layer 104, while leaving the photoresist patterns 200b formed on the upper portion of the TFT.

A second etch process is performed using the photoresist patterns 200b as a mask to remove the active layer 104 formed on the insulation substrate 100, while leaving the active layer 104 formed on the TFT region.

Figure 4D:
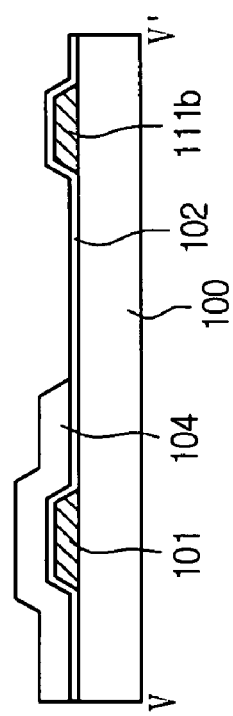

Referring to FIG. 4D, a strip process is performed to remove the photoresist patterns 200b.

Figure 4E:
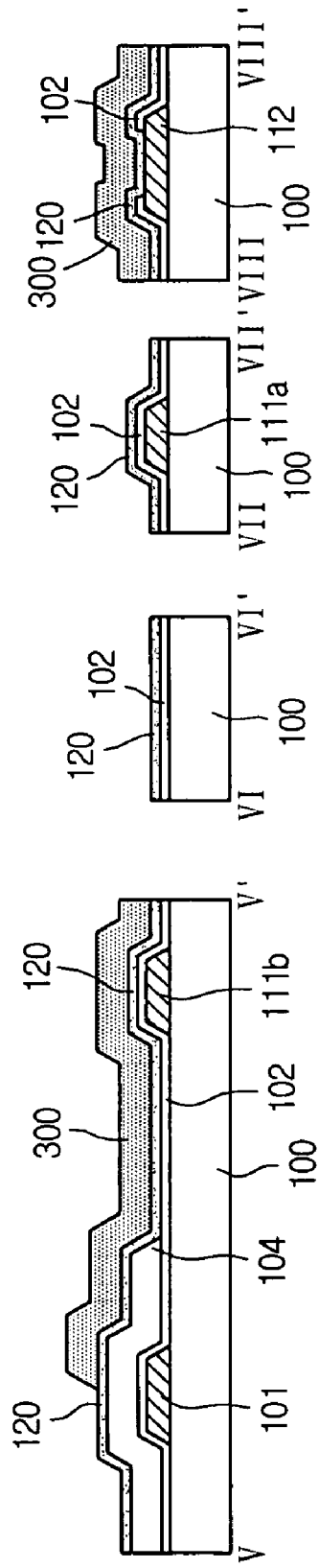

Referring to FIG. 4E, after the active layer 104 is formed on the TFT, a transparent metal layer (e.g., ITO) 120 is formed on an entire surface of the insulation substrate 100 and a third mask process is performed to coat a photoresist.

Figure 4F:
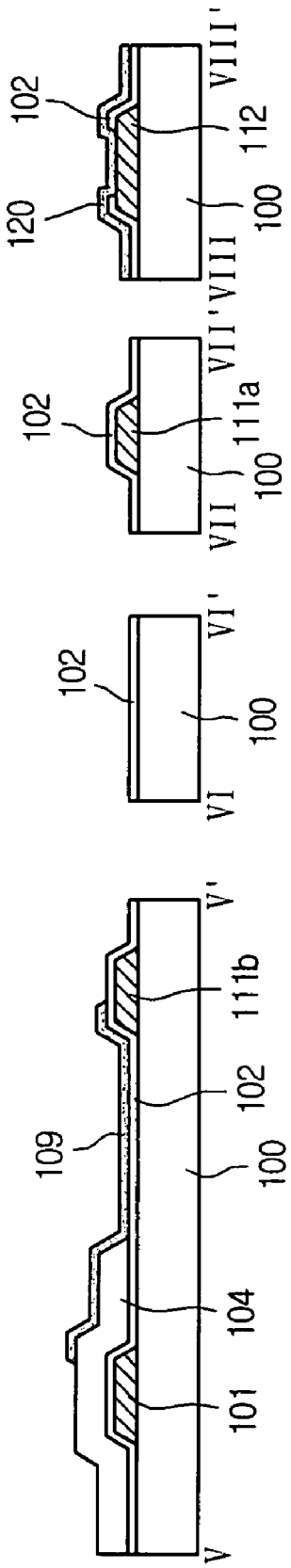

Referring to FIG. 4F, after the photoresist patterns 300 are formed on the insulation substrate 100 through the third mask process, a pixel electrode 109 is formed through a wet etch process using the photoresist patterns 300 as a mask.

When forming the pixel electrode 109, a gate contact pad 122 is formed on the gate pad 112.

An edge of the pixel electrode 109 is overlapped with a portion of an adjacent gate line 111b to form an auxiliary storage capacitance. Since only the gate insulation layer 102 exists between the pixel electrode 109 and the gate line 111b, much larger auxiliary storage capacitance can be secured, compared with the related art in which the passivation and the gate insulating layer exist.

Figure 4G:
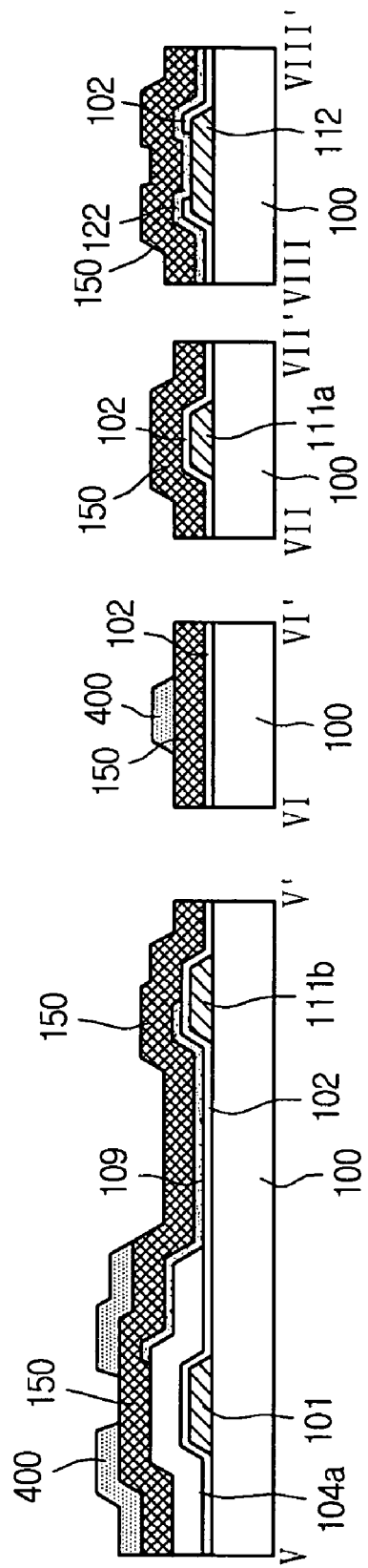

Referring to FIG. 4G, after the pixel electrode 109 is formed, a metal layer 150 is formed on an entire surface of the insulation substrate 100 in which the pixel electrode 109 is formed. Then, a photoresist is coated on an entire surface of the insulation substrate 100 so as to perform a fourth mask process.

Photoresist patterns 400 are formed by exposing and developing the insulation substrate 100 with the photoresist through the fourth mask process. Then, the insulation substrate 100 is wet etched using the photoresist patterns 400 as a mask.

Figure 4H:
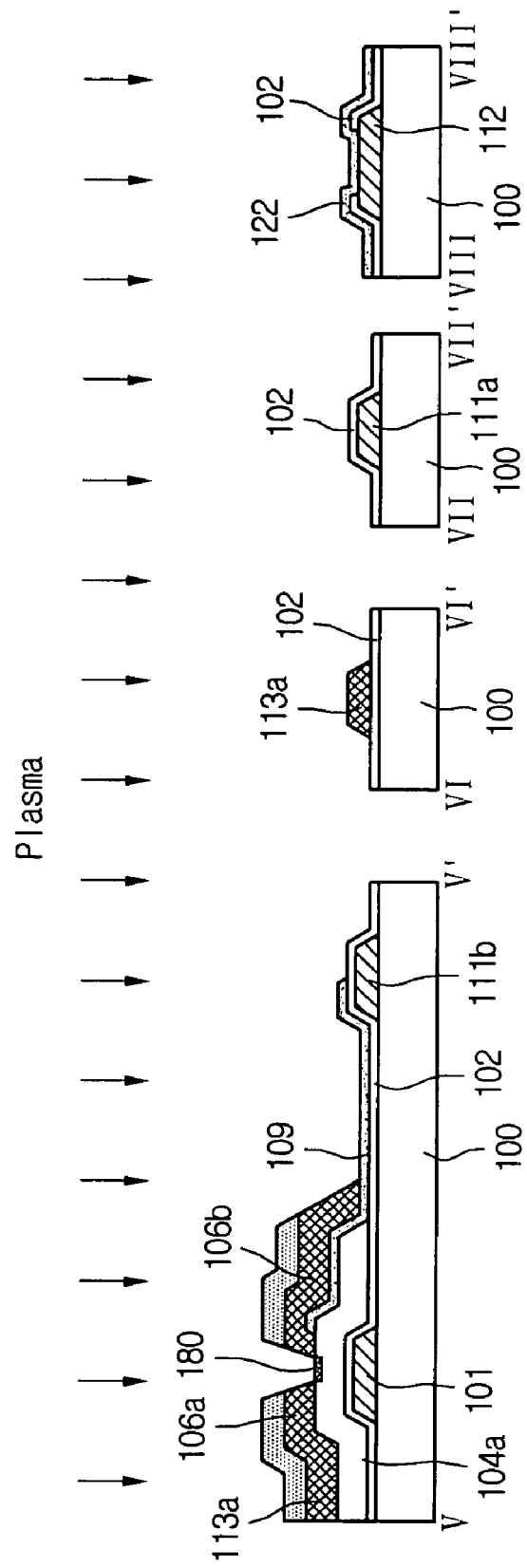
Figure 4L:
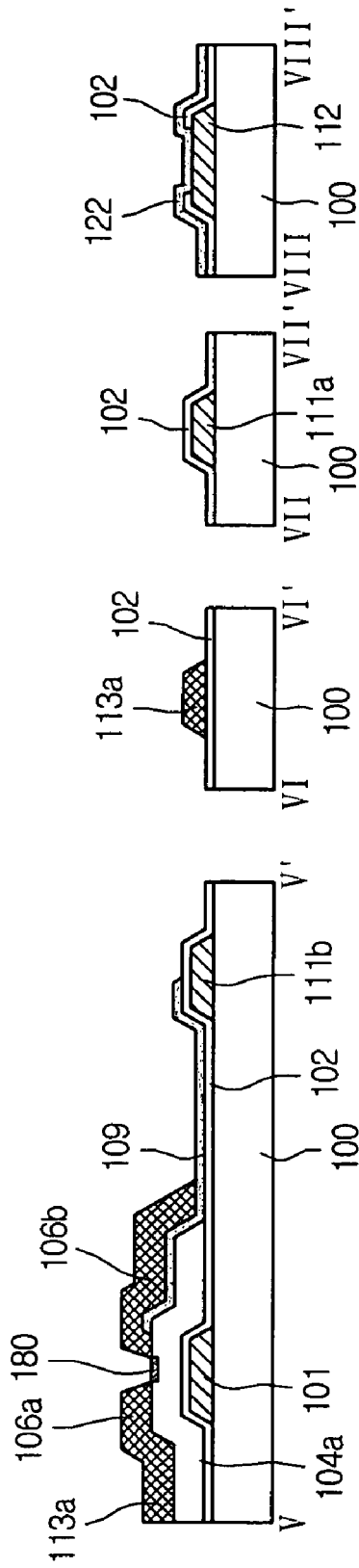

Referring to FIG. 4H, a source electrode 106a and a drain electrode 106b are formed on the active layer 104 through the etch process according to the fourth mask process. When forming the source and drain electrodes 106a and 106b, a data line 113a and a data pad are formed.

Since the source and drain electrodes 106a and 106b are formed after the formation of the pixel electrode 109, a portion where the pixel electrode 109 and the TFT are electrically contacted together exists between the drain electrode 106b and the active layer 104.

Therefore, since the pixel electrode 109 is formed in a layer lower than that of the source and drain electrodes 106a and 106b, it is possible to prevent a point defect occurring in the contact region of the pixel electrode and the drain electrode.

That is, after forming the source and drain electrodes, the passivation layer and the pixel electrode are formed. At this point, the contact defect has often occurred because the edge of the drain electrode is steeply tapered.

Specifically, the contact defect and the open defect are more severe in the fourth mask process of forming the active layer and the source and drain electrodes at the same time. However, according to the present invention, since the source and drain electrodes 106a and 106b are formed at the uppermost layer, the contact defect or the open defect can be prevented. Also, although the device is fabricated through the 4-mask process, the active layer wider than the data line 113a does not exist in the lower portion of the data line 113a, thus the degradation of the image quality in the data line region can be prevented.

In this manner, when the source and drain electrodes 106a and 106b and the data line 113a are formed along the photoresist pattern 400, an oxide layer 180 is formed in a region, where the active layer 104 of the TFT is exposed, before the strip process.

In forming the oxide layer 180, gas such as $O_2$, $N_2$ or $H_2$ is injected into a chamber, and plasma treatment is performed by applying a predetermined voltage. Consequently, the oxide layer 180 is formed on the active layer 104. The oxide layer 180 protects the active layer 104 of the TFT and its structural formula are $SiO_2$, $SiN_2$, or $SiH_2$.

Referring to FIG. 4I, after the oxide layer 180 is formed in the TFT region, a strip process is performed to remove the photoresist patterns 400.

In this embodiment, the fourth mask process is performed according to the gate electrode process/the active layer process/the pixel electrode process/the source and drain electrode process. Also, the TFT is protected by forming the oxide layer instead of the passivation layer, thereby simplifying the manufacturing process. In addition, the auxiliary storage capacitance (Cstg) formed in each pixel region is compensated by omitting the passivation layer, thereby improving the spot defect.

Although the device is fabricated through the 4-mask process, the degradation of the image picture occurring along the data line can be prevented because the active layer does not exist under the data line.

Also, since the pixel electrode is formed between the drain electrode and the active layer, it is possible to prevent the point defect occurring when the pixel electrode and the drain electrode are contacted together.

As described above, the number of the mask processes can be reduced by removing the process of forming the passivation layer.

Further, by removing the process of forming the passivation layer, the auxiliary storage capacitance formed between the pixel electrode and the gate line is compensated to prevent the spot defect.

Moreover, since the source and drain electrodes are formed after the formation of the pixel electrode, it is possible to prevent the point defect between the pixel electrode and the drain electrode.

Although the embodiments above describe a method of fabricating a liquid crystal display device with improved gate pad and TFT design, the present invention is not limited thereto. Other preferred embodiments include a method of fabricating a liquid crystal display device with improved data pad and TFT design.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a liquid crystal display device, comprising:
   performing a first mask process to form a gate line, a gate pad, and a gate electrode on a substrate;
   performing a second mask process to form an gate insulating layer and an active layer on the gate electrode;
   performing a third mask process to form a pixel electrode that contacts the active layer; and
   performing a fourth mask process to form an oxide layer, a source electrode and a drain electrode on the active layer,
   wherein a portion of the pixel electrode is overlapped with an adjacent gate line to form an auxiliary storage capacitance,
   wherein, only the gate insulating layer is disposed between the pixel electrode and the adjacent gate line, and
   wherein the oxide layer is formed only in a region of the active layer where the active layer is exposed by plasma process.

2. The method according to claim 1, wherein the second mask process uses a diffraction mask or a half-tone mask.

3. The method according to claim 1, further comprising opening an upper portion of the gate pad in the second mask process.

4. The method according to claim 1, wherein the drain electrode directly contacts the pixel electrode.

5. The method according to claim 1, further comprising forming a gate contact pad that electrically contacts the gate pad in the third mask process.

6. The method according to claim 1, wherein a data line and a data pad are formed in the fourth mask process.

7. The method according to claim 1, wherein gas injected in the plasma process is one of $O_2$, $N_2$ and $H_2$.

8. The method according to claim 1, wherein the oxide layer is one of $SiO_2$, $SiN_2$, and $SiH_2$.

9. The method according to claim 1, wherein the fourth mask process further includes performing a strip process of removing a photoresist after the forming of the oxide layer.

10. The method according to claim 1, wherein the pixel electrode is formed on a the gate insulating layer formed on the substrate.

11. A liquid crystal display device comprising:
    a gate line and a data line intersected to define a unit pixel region;
    a thin film transistor disposed at an intersecting region of the gate line and the data line;

a pixel electrode a portion of which is formed between a drain electrode and an active layer, wherein the pixel electrode directly contacts the drain electrode;

an oxide layer only in a region of the active layer of the thin film transistor where the active layer is exposed; and a gate insulating layer disposed on the gate line, wherein a portion of the pixel electrode is overlapped with an adjacent gate line to form an auxiliary storage capacitance, and wherein, only the gate insulating layer is disposed between the pixel electrode and the adjacent gate line.

12. The liquid crystal display device according to claim 11, wherein a lower portion of the drain electrode contacts the active layer and the pixel electrode.

13. The liquid crystal display device according to claim 11, wherein the pixel electrode is formed on the gate insulating layer formed on a substrate.

14. The liquid crystal display device according to claim 11, wherein the oxide layer is one of $SiO_2$, $SiN_2$, and $SiH_2$.

15. The liquid crystal display device according to claim 11, wherein the oxide layer is formed using plasma treatment.

16. The liquid crystal display device according to claim 15, wherein gas injected in the plasma process is one of $O_2$, $N_2$ and $H_2$.

17. The liquid crystal display device according to claim 11, wherein the data line is formed on the gate insulating layer on a substrate.

18. The liquid crystal display device according to claim 11, wherein a gate contact pad electrically contacts a gate pad.

* * * * *

UNITED STATES PATENT AND TRADEMARK OFFICE
CERTIFICATE OF CORRECTION

PATENT NO. : 7,589,030 B2  
APPLICATION NO. : 11/476427  
DATED : September 15, 2009  
INVENTOR(S) : Cho et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 490 days.

Signed and Sealed this

Twenty-first Day of September, 2010

David J. Kappos  
*Director of the United States Patent and Trademark Office*